United States Patent [19]

Sako et al.

[11] Patent Number: 4,476,562
[45] Date of Patent: Oct. 9, 1984

[54] METHOD OF ERROR CORRECTION

[75] Inventors: Yoichiro Sako; Kentaro Odaka, both of Tokyo, Japan

[73] Assignee: Sony Corporation, Tokyo, Japan

[21] Appl. No.: 536,824

[22] Filed: Sep. 28, 1983

Related U.S. Application Data

[63] Continuation of Ser. No. 283,924, Jul. 16, 1981, abandoned.

[30] Foreign Application Priority Data

Jul. 18, 1980 [JP] Japan ............................. 55-99258
Jul. 23, 1980 [JP] Japan ............................ 55-100814

[51] Int. Cl.³ .......................................... G06F 11/10
[52] U.S. Cl. ................................................ 371/39
[58] Field of Search ..................... 371/37, 38, 39, 40

[56] References Cited

U.S. PATENT DOCUMENTS

| | | | |
|---|---|---|---|
| 3,638,182 | 1/1972 | Burton et al. | 371/39 |
| 3,958,220 | 5/1976 | Marshall | 371/39 |
| 4,142,174 | 9/1977 | Chen et al. | 371/37 |
| 4,206,440 | 6/1980 | Doi et al. | 371/39 |
| 4,238,852 | 12/1980 | Iga et al. | 371/40 |
| 4,306,305 | 12/1981 | Doi et al. | 371/38 |
| 4,330,860 | 5/1982 | Wada et al. | 371/39 |
| 4,336,612 | 6/1982 | Inoue et al. | 371/39 |

*Primary Examiner*—Charles E. Atkinson
*Attorney, Agent, or Firm*—Lewis H. Eslinger; Alvin Sinderbrand

[57] ABSTRACT

Error detection and correction method and apparatus for use with digital data signals, which have been coded using cross-interleaving error correction codes with added check words prior to transmission, employ a plurality (k) of syndrome word signals $S_0 \ldots S_{k-1}$) that are generated by multiplying one block ($V'$) of the received digital data signals with a parity check matrix, in which each element of one predetermined row is a function of a root of an irreducible polynomial on Galois field GF (2), the syndromes are used to obtain a set of constant word signals (A, B, and C). Error detection and correction is based on these developed syndrome word and constant word signals, in which if selected syndrome word and constant word signal levels are equal to zero, there is no error word declared; if selected ones of the syndrome word and constant word signal levels are equal to zero and selected other signal levels are not equal to zero, then one error word is declared and error correction is performed by calculation of the syndrome word signals which have been determined to be the equivalent of error pattern signals; and if selected constant word signal levels are not equal to zero, additional constant word signals (D, E) are generated and an error location equation is solved to detect the error locations (i, j) and the two word errors are corrected based on the syndrome/error pattern relationship. Up to two word errors in one error correcting block can be detected and corrected and three word errors or four word errors can be corrected if the error locations are known.

23 Claims, 9 Drawing Figures

FIG. 3

| 16 BITS | | | | | | | | | | | | | | | | |
|---|---|---|---|---|---|---|---|---|---|---|---|---|---|---|---|---|
| SYNC | $U_1$ | $U_2$ | $U_3$ | $U_4$ | $U_5$ | $U_6$ | $U_7$ | $U_8$ | ---- | $U_{27}$ | $U_{28}$ | $U_{29}$ | $U_{30}$ | $U_{31}$ | $U_{32}$ |

|←— 1 TRANSMITTING BLOCK ($8 \times 32 + 16 = 272$ BITS) —→|

FIG. 6

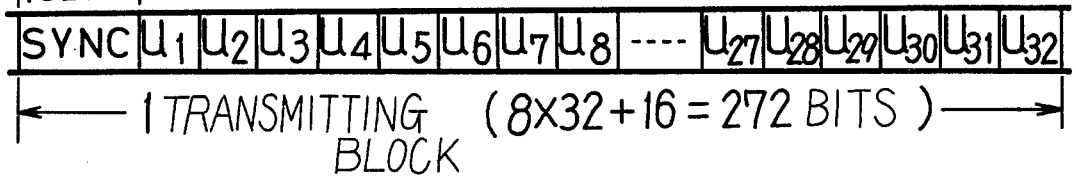

$$H_{c2} \cdot V^T = \begin{bmatrix} S_{20} \\ S_{21} \\ S_{22} \\ S_{23} \end{bmatrix}$$

$$= \begin{bmatrix} 1 & 1 & 1 & 1 & 1 & 1 & --- & 1 & 1 & 1 & 1 & 1 \\ \alpha^{27} & \alpha^{26} & \alpha^{25} & \alpha^{24} & \alpha^{23} & \alpha^{22} & --- & \alpha^4 & \alpha^3 & \alpha^2 & \alpha^1 & 1 \\ \alpha^{54} & \alpha^{52} & \alpha^{50} & \alpha^{48} & \alpha^{46} & \alpha^{44} & --- & \alpha^8 & \alpha^6 & \alpha^4 & \alpha^2 & 1 \\ \alpha^{81} & \alpha^{78} & \alpha^{75} & \alpha^{72} & \alpha^{69} & \alpha^{66} & --- & \alpha^{12} & \alpha^9 & \alpha^6 & \alpha^3 & 1 \end{bmatrix} \begin{bmatrix} W_{12n-12, A} \\ W_{12n-12, B} \\ W_{12n+1-12, A} \\ W_{12n+1-12, B} \\ W_{12n+4-12, A} \\ W_{12n+4-12, B} \\ W_{12n+5-12, A} \\ W_{12n+5-12, B} \\ W_{12n+8-12, A} \\ W_{12n+8-12, B} \\ W_{12n+9-12, A} \\ W_{12n+9-12, B} \\ W_{12n+2, A} \\ W_{12n+2, B} \\ W_{12n+3, A} \\ W_{12n+3, B} \\ W_{12n+6, A} \\ W_{12n+6, B} \\ W_{12n+7, A} \\ W_{12n+7, B} \\ W_{12n+10, A} \\ W_{12n+10, B} \\ W_{12n+11, A} \\ W_{12n+11, B} \\ Q_{12n} \\ Q_{12n+1} \\ Q_{12n+2} \\ Q_{12n+3} \end{bmatrix}$$

FIG. 5

$$H_{c1} \cdot V^T = \begin{bmatrix} S_{10} \\ S_{11} \\ S_{12} \\ S_{13} \end{bmatrix}$$

$$= \begin{bmatrix} 1 & 1 & 1 & 1 & 1 & --- & 1 & 1 & 1 & 1 & 1 \\ \alpha^{31} & \alpha^{30} & \alpha^{29} & \alpha^{28} & \alpha^{27} & --- & \alpha^{4} & \alpha^{3} & \alpha^{2} & \alpha^{1} & 1 \\ \alpha^{62} & \alpha^{60} & \alpha^{58} & \alpha^{56} & \alpha^{54} & --- & \alpha^{8} & \alpha^{6} & \alpha^{4} & \alpha^{2} & 1 \\ \alpha^{93} & \alpha^{90} & \alpha^{87} & \alpha^{84} & \alpha^{81} & --- & \alpha^{12} & \alpha^{9} & \alpha^{6} & \alpha^{3} & 1 \end{bmatrix} \begin{bmatrix} W_{12n-12}, A \\ W_{12n-12(1D+1)}, B \\ W_{12n+1-12(2D+1)}, A \\ W_{12n+1-12(3D+1)}, B \\ W_{12n+4-12(4D+1)}, A \\ W_{12n+4-12(5D+1)}, B \\ W_{12n+5-12(6D+1)}, A \\ W_{12n+5-12(7D+1)}, B \\ W_{12n+8-12(8D+1)}, A \\ W_{12n+8-12(9D+1)}, B \\ W_{12n+9-12(10D+1)}, A \\ W_{12n+9-12(11D+1)}, B \\ Q_{12n-12(12D)} \\ Q_{12n+1-12(13D)} \\ Q_{12n+2-12(14D)} \\ Q_{12n+3-12(15D)} \\ W_{12n+2-12(16D)}, A \\ W_{12n+2-12(17D)}, B \\ W_{12n+3-12(18D)}, A \\ W_{12n+3-12(19D)}, B \\ W_{12n+6-12(20D)}, A \\ W_{12n+6-12(21D)}, B \\ W_{12n+7-12(22D)}, A \\ W_{12n+7-12(23D)}, B \\ W_{12n+10-12(24D)}, A \\ W_{12n+10-12(25D)}, B \\ W_{12n+11-12(26D)}, A \\ W_{12n+11-12(27D)}, B \\ P_{12n} \\ P_{12n+1} \\ P_{12n+2} \\ P_{12n+3} \end{bmatrix}$$

METHOD OF ERROR CORRECTION

This is a continuation of application Ser. No. 283,924, filed July 16, 1981, now abandoned.

BACKGROUND OF THE INVENTION

1. Field of the Invention

The present invention relates generally to a method of error correction, and in particular is directed to a method of error correction by which an error correcting code (a kind of adjacent code) capable of correcting up to two word errors in one block is used to correct errors at high speed.

2. Description of the Prior Art

There has been previously proposed, for example, in copending application Ser. No. 218,256, filed Dec. 19, 1980, now U.S. Pat. No. 4,355,392 issued Oct. 19, 1982, and having a common assignee herewith, a data transmission system effective for correcting burst errors using a so-called cross-interleave technique. In such cross-interleave technique, words in a PCM (pulse code modulated) data signal series are provided in plural sequences on plural respective channels arranged in a first arrangement state, and are furnished to a first error-correcting coder to generate therefrom a first check word series. This first check word series and the PCM data signal series in the plural channels are converted to a second arrangement state. Then, one word in the second arrangement state for each of the PCM data signal sequences in the plural channels is furnished to a second error correcting coder to generate therefrom a second check word series, so that a double interleave (i.e., double rearrangement) is carried out for each word. The purpose of the double interleave is to reduce the number of erroneous words in any group of words contained in a common error-correcting block when the check word contained in such erro-correcting block and the PCM data associated therewith are dispersed and transmitted. Any such erroneous words are dispersed among several blocks, and are returned to the original arrangement thereof at the receiving side. In other words, when a burst error develops during transmission, the burst error can be dispersed. If the above interleave is performed twice, the first and second check words each are used to correct words in distinct error correcting blocks. Thus, even if an error cannot be corrected by one of the first and second check words, the error can be corrected by the other check word. Therefore, this technique provides a significant advance in error correcting ability for burst errors.

However, when even one bit in one word is discovered to be in error, the entire word is considered erroneous. Therefore, when a received data signal has a relatively large number of random errors, the above-described double interleave technique is not always sufficiently powerful for correcting these random errors.

To this end, it is proposed that an error correcting code high in error correcting ability, for example, Reed-Solomon (RS) Code, Bose-Chaudhuri-Hocquenghem (BCH) code, or a variant of a b-adjacent code, which can corred K word errors, for example, two word errors in one block, and can also correct M word errors, for example, three word errors or four word errors, if the location of errors is known, is combined with the above multi-interleave technique.

This error correcting code enables the simplification of the construction of a decoder when only one word error is to be corrected.

However, when two word errors are to be corrected, since the fundamental algorithm of error correction is such that by using the syndrome it is checked in the first step whether or not there is an error, it is checked in the second step whether or not the error is one word error and it is checked in the third step whether or not the error is two word errors, the time period required to complete all the steps becomes rather long. This problem will appear especially troublesome when the error locations of two word errors are calculated.

OBJECTS AND SUMMARY OF THE INVENTION

Accordingly, it is an object of this invention to provide an improved method of error correction which can solve the prior art problem and correct errors at high speed.

Another object of the invention is to provide a method of error correction by which the construction of calculating circuits and other hardware used in an error correcting apparatus can be simplified.

According to an aspect of the present invention, a method of error correction of data having n words in one block and each word comprising m bits is provided which method comprises the steps of:

obtaining k syndromes $S_0$ to $S_{k-1}$ by the following calculation of the one block $V^T$ consisting of received n words and a parity check matrix H $$H \cdot V^T = \begin{bmatrix} S_0 \\ S_1 \\ \cdot \\ \cdot \\ S_{k-2} \\ S_{k-1} \end{bmatrix}$$

where the parity check matrix H has n columns and k rows, and in which each element of one predetermined row is selected from $\alpha^0 (=1)$ to $\alpha^{2m-2}$, the element $\alpha$ being a root to satisfy $F(x)=0$ when the $F(x)$ is an irreducible polynomial on a galois field GF(2), so that the same value does not appear twice in said predetermined row, and wherein the elements in the remaining rows are selected to be a given power, for all the elements in each respective row, of the corresponding elements in said predetermined row;

obtaining the following constants A, B and C based upon said syndromes $$\begin{bmatrix} A_1 = S_0 S_2 + S_1^2 \\ B_1 = S_1 S_2 + S_0 S_3 \\ C_1 = S_1 S_3 + S_2^2 \end{bmatrix}$$

$$\begin{bmatrix} A_2 = S_1 S_3 + S_2^2 \\ B_2 = S_2 S_3 + S_1 S_4 \\ C_2 = S_2 S_4 + S_3^2 \end{bmatrix}$$

.
.
.

-continued $$\begin{bmatrix} A_{k-3} = S_{k-4}S_{k-2} + S_{k-3}{}^2 \\ B_{k-3} = S_{k-3}S_{k-2} + S_{k-4}S_{k-1}; \\ C_{k-3} = S_{k-3}S_{k-1} + S_{k-2}{}^2 \end{bmatrix}$$

and carrying out error detection and error correction which are expressed below as (a), (b) and (c) based upon said syndromes and constants (a) where $S_O=S_3=S_4=\ldots=S_{k-1}=0$, $A_1=A_2=\ldots=A_{k-3}=0$, $B_1=B_2=\ldots=B_{k-3}=0$, and $C_{k-3}=0$ are satisfied, it is detected that there is no error word, (b) when $S_0\neq 0$, $S_3\neq 0$, $S_3\neq 0,\ldots,S_{k-1}\neq 0$, $A_{k'}=0$, $B_{k'}=0$ where $k'=1$ to $k-3$ and $C_{k-3}=0$ are satisfied, it is judged that there is one word error, and then error correction is performed by the calculation of said syndromes, and (c) when $A_{k'}\neq 0$, $B_k=0$ and $C_{k-3}\neq 0$ are satisfied, the following are assumed $$\begin{cases} \left(\dfrac{B_1}{A_1} = \dfrac{B_2}{A_2} = \ldots = \dfrac{B_{k-3}}{A_{k-3}} = D\right) \\ \left(\dfrac{C_1}{A_1} = \dfrac{C_2}{A_2} = \ldots = \dfrac{C_{k-3}}{A_{k-3}} = E\right) \end{cases}$$

and the error location equation of $\alpha^{2i}+D\alpha^i+E=0$ is solved to detect error locations i and j and two word errors are corrected.

The other objects, features and advantages of the present invention will become apparent from the following description taken in conjunction with the accompanying drawings through which the like references designate the same elements and parts.

BRIEF DESCRIPTION OF THE DRAWINGS

FIG. 3 shows an arrangement of a block of encoded data at transmission;

FIGS. 5, 6 and 7 are diagrams used to explain the operation of the error correcting decoder.

DESCRIPTION OF THE PREFERRED EMBODIMENTS

Figure 1:
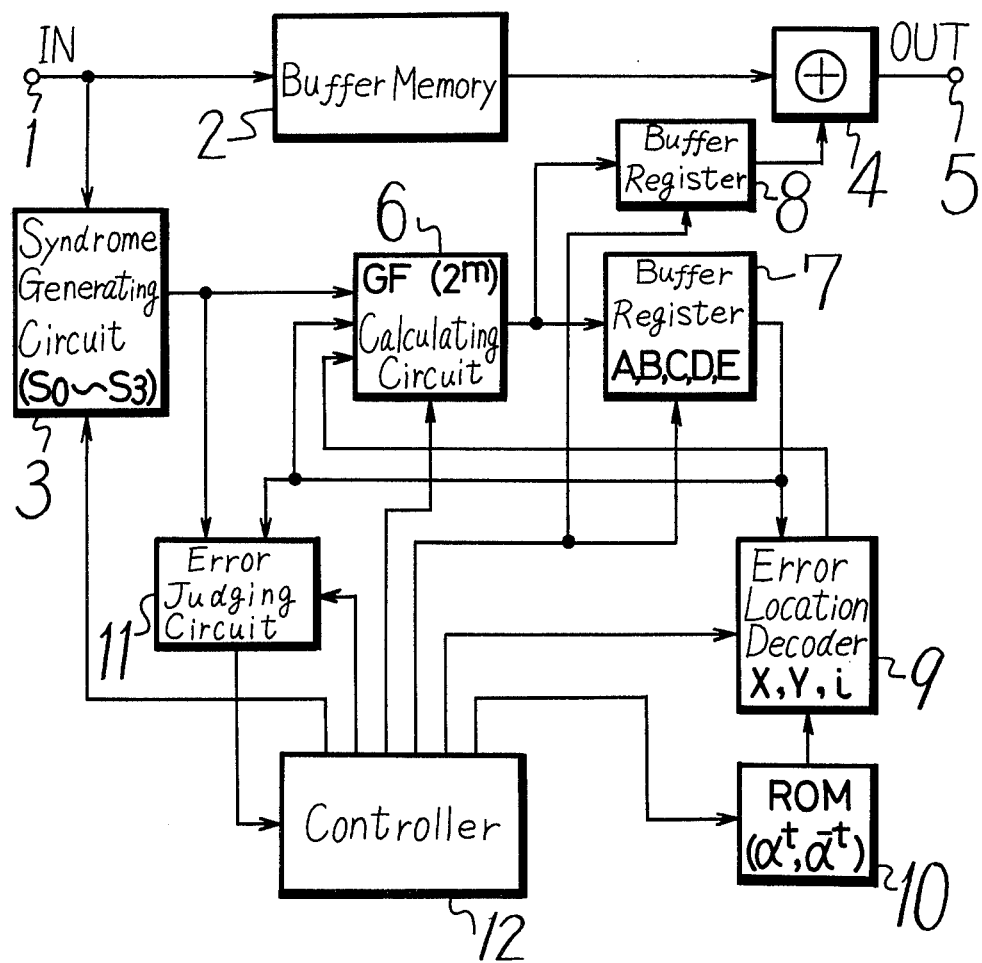
FIG. 1 is a block diagram showing an example of an error correcting apparatus to which the present invention is applied.

First, an error correcting code used in this invention will be explained. In this discussion, the error correcting code is expressed by a vector representation or a cyclic group representation.

To begin, an irreducible mth order polynominal F(x) will be considered on a galois field GF(2). On the field GF(2) which contains only the elements "0" and "1", the irreducible polynominal F(x) has no real root. Thus, an imaginary (or complex) root $\alpha$, which will satisfy $F(x)=0$, will be considered. At this time $2^m$ different elements 0, $\alpha\alpha^2$, $\alpha^3,\ldots\alpha^{2m-1}(=\alpha^0=1)$, each being a power of $\alpha$ and containing a zero element, form an extension galois field $GF(2^m)$. This extension field $GF(2^m)$ is a polynomial ring with an mth order irreducible polynomial F(x), over the field GF(2) as a modulo. The element of $GF(2^m)$ can be expressed as a linear combination of 1, $\alpha=[x]$, $\alpha^2=[x^2],\ldots\alpha^{m-1}=[x^{m-1}]$. That is, these elements can be expressed $$a_0+a_1[x]+a_2[x^2]+\ldots +a_{m-1}[x^{m-1}]=a_0+a_1\alpha+a_2\alpha^2+\ldots a_{m-1}\alpha^{m-1}$$

or $$(a_{m-1},a_{m-2},\ldots a_2, a_1, a_0)$$

where $a_0, a_1,\ldots a_{m-1}$ belong to GF(2).

As an example, consider the extension field $GF(2^8)$ and, as a modulo, the polynomial $F(x)=x^8+x^4+x^3+x^2+1$, (all variables being eight-bit data). This field $GF(2^8)$ can be expressed as follows:

$$a_7x^7+a_6x^6+a_5x^5+a_4x^4+a_3x^3+a_2x^2+a_1x+a_0 \text{ or}$$

$$(a_7, a_6, a_5, a_4, a_3, a_2, a_1, a_0)$$

Therefore, by way of example, $a_7$ is considered the MSB (most significant bit) and $a_0$ is considered the LSB (least significant bit). Since $a_n$ belongs to GF(2), its elements are either 0 or 1.

Further, from the polynomial F(x) there is derived the following matrix T of m rows by m columns.

$$T = \begin{bmatrix} 0 & 0 & \ldots & 0 & a_0 \\ 1 & 0 & \ldots & 0 & a_1 \\ 0 & 1 & \ldots & 0 & a_2 \\ \vdots & \vdots & & \vdots & \vdots \\ 0 & 0 & \ldots & 1 & a_{m-1} \end{bmatrix}$$

As an alternative expression, there can be used an expression which includes a cyclic group which recognizes that the remainder of the extension galois field $GF(2^m)$ (except the zero element) forms a multiplicative group with the order $2^m-1$. If the elements of $GF(2^m)$ are expressed by using a cyclic group, the following are obtained;

$$0, 1(32\ \alpha^{2m-1}), \alpha, \alpha^2, \alpha^3,\ldots \alpha^{2m-2}$$

In an example of the present invention, when m bits form one word and n words form one block, k check words are generated based upon a parity check matrix H, such as the following:

$$H = \begin{bmatrix} 1 & 1 & \ldots & 1 & 1 \\ \alpha^{n-1} & \alpha^{n-2} & \ldots & \alpha & 1 \\ \alpha^{2(n-1)} & \alpha^{2(n-2)} & \ldots & \alpha^2 & 1 \\ \vdots & \vdots & & \vdots & \vdots \\ \alpha^{(k-1)(n-1)} & \alpha^{(k-1)(n-2)} & & \alpha^{k-1} & 1 \end{bmatrix}$$

Further, the parity check matrix H can be similarly expressed by using the matrix T as follows:

$$H = \begin{bmatrix} I & I & \ldots & I & I \\ T^{n-1} & T^{n-2} & \ldots & T^1 & I \\ T^{2(n-1)} & T^{2(n-2)} & & T^2 & I \\ \cdot & \cdot & & \cdot & \cdot \\ \cdot & \cdot & & \cdot & \cdot \\ T^{(k-1)(n-1)} & T^{(k-1)(n-2)} & & T^{k-1} & I \end{bmatrix}$$

where I is a unit matrix of m rows and m columns.
As mentioned above, the expressions using the root $\alpha$ are fundamentally the same as those using a generating matrix T.

Further, if the case where 4 (k=4) check words are employed is exemplified, the parity check matrix H becomes as follows:

$$H = \begin{bmatrix} 1 & 1 & \ldots & 1 & 1 \\ \alpha^{n-1} & \alpha^{n-2} & \ldots & \alpha & 1 \\ \alpha^{2(n-1)} & \alpha^{2(n-2)} & \ldots & \alpha^2 & 1 \\ \alpha^{3(n-1)} & \alpha^{3(n-2)} & \ldots & \alpha^3 & 1 \end{bmatrix}$$

In this case, if a single block of received data is expressed as a column vector $v = (\hat{W}_{n-1}, \hat{W}_{n-2}, \ldots \hat{W}_1, \hat{W}_0)$ where $\hat{W}_i = W_i + e_i$, $e_i$ is an error pattern, four syndromes $S_0, S_1, S_2$ and $S_3$ generated in the receiving side are expressed as follows:

$$\begin{bmatrix} S_0 \\ S_1 \\ S_2 \\ S_3 \end{bmatrix} = H \cdot V^T$$

This error correcting code can correct up to two word errors in one error correcting block and also can correct three word errors or four word errors if the error location is known.

In each block there are contained four check words ($p = W_3$, $q = W_2$, $r = W_1$, $s = W_0$). These check words can be obtained from the following relationships:

$$p + q + r + s = \Sigma W_i = a$$

$$\alpha^3 p + \alpha^2 q + \alpha r + s = \Sigma \alpha^i W_i = b$$

$$\alpha^6 p + \alpha^4 q + \alpha^2 r + s = \Sigma \alpha^{2i} W_i = c$$

$$\alpha^9 p + \alpha^6 q + \alpha^3 r + s = \Sigma \alpha^{3i} W_i = d$$

where $\Sigma$ is $\sum_{i=4}^{n-1}$.

Although the process of the calculation will be omitted, the calculation result is as follows:

$$\begin{bmatrix} p \\ q \\ r \\ s \end{bmatrix} = \begin{bmatrix} \alpha^{212} & \alpha^{153} & \alpha^{152} & \alpha^{209} \\ \alpha^{156} & \alpha^2 & \alpha^{135} & \alpha^{152} \\ \alpha^{158} & \alpha^{138} & \alpha^2 & \alpha^{153} \\ \alpha^{218} & \alpha^{158} & \alpha^{156} & \alpha^{212} \end{bmatrix} \begin{bmatrix} a \\ b \\ c \\ d \end{bmatrix}$$

The coder provided in the transmission side forms the check words p, q, r, and s in the above manner.

Next, the fundamental algorithm of the error correction will be described when data including the check words generated as above are transmitted and then received.

(1) If there is no error, the syndromes are all zero:

$$S_0 = S_1 = S_2 = S_3 = 0$$

(2) If there is one word error (an error pattern being represented as ei), $S_0 = e_i$, $S_1 = \alpha^i e_i$, $S_2 = \alpha^{2i} e_i$, $S_3 = \alpha^{3i} e_i$.
Thus, the following relations are established:

$$\alpha^i S_0 = S_1$$

$$\alpha^i S_1 = S_2$$

$$\alpha^i S_2 = S_3$$

One word error or none can be judged by whether the above relation is established or not when i is successively changed. Or the following relation is established.

$$\frac{S_1}{S_0} = \frac{S_2}{S_1} = \frac{S_3}{S_2} = \alpha^i$$

Thus, the pattern of $\alpha^i$ is compared with that previously stored in a ROM (read only memory) to know the error location i. At this time the syndrome $S_0$ becomes the error pattern ei itself.

(3) In the case of two word errors (ei and ej), the syndromes follow the relationships:

$$S_0 = e_i + e_j$$

$$S_1 = \alpha^i e_i + \alpha^j e_j$$

$$S_2 = \alpha^{2i} e_i + \alpha^{2j} e_j$$

$$S_3 = \alpha^{3i} e_i + \alpha^{3j} e_j$$

The above equations can be modified as follows:

$$\alpha^j S_0 + S_1 = (\alpha^i + \alpha^j) e_i$$

$$\alpha^j S_1 + S_2 = \alpha^i (\alpha^i + \alpha^j) e_i$$

$$\alpha^j S_2 + S_3 = \alpha^{2i} (\alpha^i + \alpha^j) e_i$$

Accordingly, if the following equations are established, two word errors are discriminated.

$$\alpha^i (\alpha^j S_0 + S_1) = \alpha^j S_1 + S_2$$

$$\alpha^i (\alpha^j S_1 + S_2) = \alpha^j S_2 + S_3$$

If the above equations are established, it is judged as two word errors. That is, the combination of i and j is varied to check whether or not the relation of the above equations is established. Thus, the error patterns at this time are expressed as follows:

$$ei = \frac{S_0 + \alpha^{-j} S_1}{1 + \alpha^{i-j}} \text{ and } ej = \frac{S_0 + \alpha^{-i} S_1}{1 + \alpha^{j-i}}$$

(4) Where three word errors (ei, ej and ek) occur, the syndromes can be expressed:
$S_0 = e_i + e_j + e_k$ $$S_1 = \alpha^i e_i + \alpha^j e_j + \alpha^k e_k$$

$$S_2 = \alpha^{2i} e_i + \alpha^{2j} e_j + \alpha^{2k} e_k$$

$S_3 = \alpha^{3l}ek + \alpha^{3j}ej + \alpha^{3k}ek$

The above equations can be modified as follows:

$\alpha^k S_0 + S_1 = (\alpha^i + \alpha^k)ei + (\alpha^j + \alpha^k)ej$ $\alpha^k S_1 + S_2 = \alpha^i(\alpha^i + \alpha^k)ei + \alpha^j(\alpha^j + \alpha^k)ej$ $\alpha^k S_2 + S_3 = \alpha^{2i}(\alpha^i + \alpha^k)ei + \alpha^{2j}(\alpha^j + \alpha^k)ej$ As a result, the following equations are derived:

$\alpha^j(\alpha^k S_0 + S_1) + (\alpha^k S_1 + S_2) = (\alpha^i + \alpha^j)(\alpha^i + \alpha^k)ei$ $\alpha^j(\alpha^k S_1 + S_2) + (\alpha^k S_2 + S_3) = \alpha^i(\alpha^i + \alpha^j)(\alpha^i + \alpha^k)ei$ Accordingly, if the following equation is established, which is a necessary condition for three word errors, then all three word errors can be discriminated.

$\alpha^i\{\alpha^j(\alpha^k S_0 + S_1) + (\alpha^k S_1 + S_2)\} = \alpha^j(\alpha^k S_1 + S_2) + (\alpha^k S_2 + S_3)$ The respective error patterns at this time are expressed as follows:

$$ei = \frac{S_0 + (\alpha^{-j} + \alpha^{-k})S_1 + \alpha^{-j-k}S_2}{(1 + \alpha^{i-j})(1 + \alpha^{i-k})}$$

$$ej = \frac{S_0 + (\alpha^{-k} + \alpha^{-i})S_1 + \alpha^{-k-i}S_2}{(1 + \alpha^{j-i})(1 + \alpha^{j-k})},$$

and $$ek = \frac{S_0 + (\alpha^{-i} + \alpha^{-j})S_1 + \alpha^{-i-j}S_2}{(1 + \alpha^{k-i})(1 + \alpha^{k-j})}$$

In fact, the construction of a circuit for correcting three word errors is rather complicated and the time required for the correcting operation is long. Therefore, in practice, an error correcting operation is used in which the above operation is combined with an error correcting operation in which the error locations of i, j, k and l are known by an error indication bit, or pointer and the above equations are employed for checking.

(5) Where there are four work errors (ei, ej, ek and el), the syndromes are expressed as follows:

$S_0 = ei + ej + ek + el$ $S_1 = \alpha^i ei + \alpha^j ej + \alpha^k ek + \alpha^l el$ $S_2 = \alpha^{2i} ei + \alpha^{2j} ej + \alpha^{2k} ek + \alpha^{2l} el$ $S_3 = \alpha^{3i} ei + \alpha^{3j} ej + \alpha^{3k} ek + \alpha^{3l} el$ The above equations are modified as follows:

$$ei = \frac{S_0 + (\alpha^{-j} + \alpha^{-k} + \alpha^{-l})S_1 + (\alpha^{-j-k} + \alpha^{-k-l} + \alpha^{-l-j})S_2 + \alpha^{-j-k-l}S_3}{(1 + \alpha^{i-j})(1 + \alpha^{i-k})(1 + \alpha^{i-l})}$$

$$ej = \frac{S_0 + (\alpha^{-k} + \alpha^{-l} + \alpha^{-i})S_1 + (\alpha^{-k-l} + \alpha^{-l-i} + \alpha^{-i-k})S_2 + \alpha^{-k-l-i}S_3}{(1 + \alpha^{j-i})(1 + \alpha^{j-k})(1 + \alpha^{j-l})}$$

$$ek = \frac{S_0 + (\alpha^{-l} + \alpha^{-i} + \alpha^{-j})S_1 + (\alpha^{-l-i} + \alpha^{-i-j} + \alpha^{-j-l})S_2 + \alpha^{-l-i-j}S_3}{(1 + \alpha^{k-i})(1 + \alpha^{k-j})(1 + \alpha^{k-l})}$$

$$el = \frac{S_0 + (\alpha^{-i} + \alpha^{-j} + \alpha^{-k})S_1 + (\alpha^{-i-j} + \alpha^{-i-k} + \alpha^{-k-j})S_2 + \alpha^{-i-j-k}S_3}{(1 + \alpha^{l-i})(1 + \alpha^{l-j})(1 + \alpha^{l-k})}$$

Thus, when the error locations (i, j, k, l) are indicated by pointers, the error can be corrected by the above calculation.

The fundamental algorithm of the above error correction is that at the first step it is checked by the syndromes $S_0$ to $S_3$ whether there is an error or not, at the second step it is checked whether the error is one word error or not, and at the third step it is checked whether the error is two word errors or not. When up to two word errors are corrected, the time to complete all the steps becomes long, which poses a problem especially when the error location of two word errors is obtained.

Now, description will be given on the present invention, which is effective when the correction of two word errors are assumed without causing the above problem.

The equations of the syndromes $S_0$, $S_1$, $S_2$ and $S_3$ in the case of two word errors (ei, ej) are as follows:

$S_0 = ei + ej$ $S_1 = \alpha^i ei + \alpha^j ej$ $S_2 = \alpha^{2i} ei + \alpha^{2j} ej$ $S_3 = \alpha^{3i} ei + \alpha^{3j} ej$ The above equations are modified as follows:

$(\alpha^i S_0 + S_1)(\alpha^i S_2 + S_3) = (\alpha^i S_1 + S_2)^2$

The equation is further modified and the following error location polynominal is obtained:

$(S_0 S_2 + S_1^2)\alpha^{2i} + (S_1 S_2 + S_0 S_3)\alpha^i + (S_1 S_3 + S_2^2) = 0$ Now, the constants of the respective terms of the above polynominal are assumed as follows:

$S_0 S_2 + S_1^2 = A$ $S_1 S_2 + S_0 S_3 = B$ $S_1 S_3 + S_2^2 = C$

By using the above constants A, B and C, the error location of two word errors can be obtained.

(1) In the case of no error:

A = B = C = 0, $S_0$ = 0 and $S_3$ = 0

(2) In the case of one word error:
If A = B = C = 0, $S_0 \neq 0$ and $S_3 \neq 0$ are satisfied, the error is judged as one word error. From the relation $\alpha^i = (S_1/S_0)$, the error location i can be easily determined. Thus, the error is corrected by using the relation $ei = S_0$.

(3) In the case of two word errors:

If an error occurs more than two words, $A \neq 0$, $B \neq 0$ and $C \neq 0$ are established and hence the judgement thereof becomes quite simple.

At this time, the following equation is established.

$$A\alpha^{2i} + B\alpha^i + C = 0$$

where $i = 0$ to $(n-1)$.

Now, if it is assumed that $(B/A) = D$ and $(C/A) = E$, the following equations are respectively obtained.

$$D = \alpha^i + \alpha^j$$

$$E = \alpha^i \cdot \alpha^j$$

Hence, the following equation is derived, $$\alpha^{2i} + D\alpha^i + E = 0$$

If the difference between two error locations is taken as t, i.e., $j = i + t$, the following equations are obtained.

$$D = \alpha^i(1 + \alpha^t)$$

$$E = \alpha^{2i+t}$$

Accordingly, the following equation is derived:

$$\frac{D^2}{E} = \frac{(1+\alpha^t)^2}{\alpha^t} = \alpha^{-t} + \alpha^t$$

If the value of $\alpha^{-t} + \alpha^t$ of each value of $t = 1$ to $(n-1)$ is previously written in a ROM and it is detected that the value is coincident with the value of $(D^2/E)$ calculated from the output of the ROM and a received word, t can be obtained. If the above coincidence is not detected, it means that errors are occurring in more than three words.

Thus, if the following expressions are assumed, $$X = 1 + \alpha^t$$

$$Y = 1 + \alpha^{-t} = D^2/E + X$$

The following expressions are obtained:

$$\alpha^i = D/X$$

$$\alpha^j = D/Y$$

From the above expressions, the error locations i and j are obtained. Then, the error patterns ei and ej are expressed as follows:

$$ei = \frac{(\alpha^j S_0 + S_1)}{D} = \frac{S_0}{Y} + \frac{S_1}{D}$$

$$ej = \frac{(\alpha^i S_0 + S_1)}{D} = \frac{S_0}{X} + \frac{S_1}{D}$$

Thus, the errors can be corrected.

The above modified correction algorithm can appreciably shorten the time required to calculate the error location upon correcting two word errors are compared with that of the fundamental algorithm.

Further, if the number k of the check words is increased, the error correcting ability can be improved accordingly. For example, if k is selected as 6, three word errors can be corrected, and six word errors can be corrected when the error location is known.

FIG. 1 shows an example of the error correcting apparatus to which the present invention is applied. In this figure, 1 designates an input terminal to which received data are applied. The data are then fed to a buffer memory 2 and a syndrome generating circuit 3. The buffer memory 2 serves to delay the received data by the time required to detect an error and generate an error pattern and supplies the output thereof to an error correcting circuit 4 (an adder of modulo 2). The output from the error correcting circuit 4 is derived from an output terminal 5.

In the syndrome generating circuit 3, the calculation of $H \cdot V^T$ is carried out to generate the syndromes $S_0$, $S_1$, $S_2$ and $S_3$ which are then fed to a calculating circuit 6 for $GF(2^m)$. This calculating circuit 6 performs such calculations that the constants A, B, C, D and E and also the error patterns are generated. The constants from the calculating circuit 6 are fed to and stored in a buffer register 7, and the error pattern from the calculating circuit 6 is fed to and stored in a buffer register 8, respectively. The error pattern is supplied from the buffer register 8 to the error correcting circuit 4 to carry out the error correction. In the example of FIG. 1, an error location decoder 9 and a ROM (read only memory) 10 are respectively provided. The constants D and E from the buffer register 7 and outputs $\alpha^t$ and $\alpha^{-t}$ from the ROM 10 are all fed to the error location decoder 9 which then produces the error location i and new constants X and Y. The new constants X, Y, the constant D from the buffer register 7 and the syndromes are supplied to the calculating circuit 6, so that the circuit 6 produces the error patterns ei and ej which are fed to the buffer register 8 to be stored therein.

The syndromes $S_0$ and $S_3$ from the syndrome generating circuit 3 and the constants A, B and C from the buffer register 7 are fed to an error judging circuit 11 which judges whether there is an error or not, an error is one word error or not, the error is two word errors or not and the error is more than two word errors. The judged result is fed therefrom to a controller 12. This controller 12 serves to supply clock pulses or control signals, which are restricted to have a predetermined timing relation, to the respective circuits.

As will be understood from the above description, according to the present invention, the values of $\alpha^{-t}$ and $\alpha^t$, where $t = 1$ to $(n-1)$, are memorized in the ROM 10 and the output from the ROM 10 is compared with the constant produced by calculating the syndrome to carry out the detections of two word errors and the error location, so that the error detection and the error correction can be performed at high speed.

Now, a practical embodiment of the present invention, which is applied, as an example, to an apparatus which will record and reproduce an audio PCM signal, will be described with reference to the attached drawings.

Figure 2A:
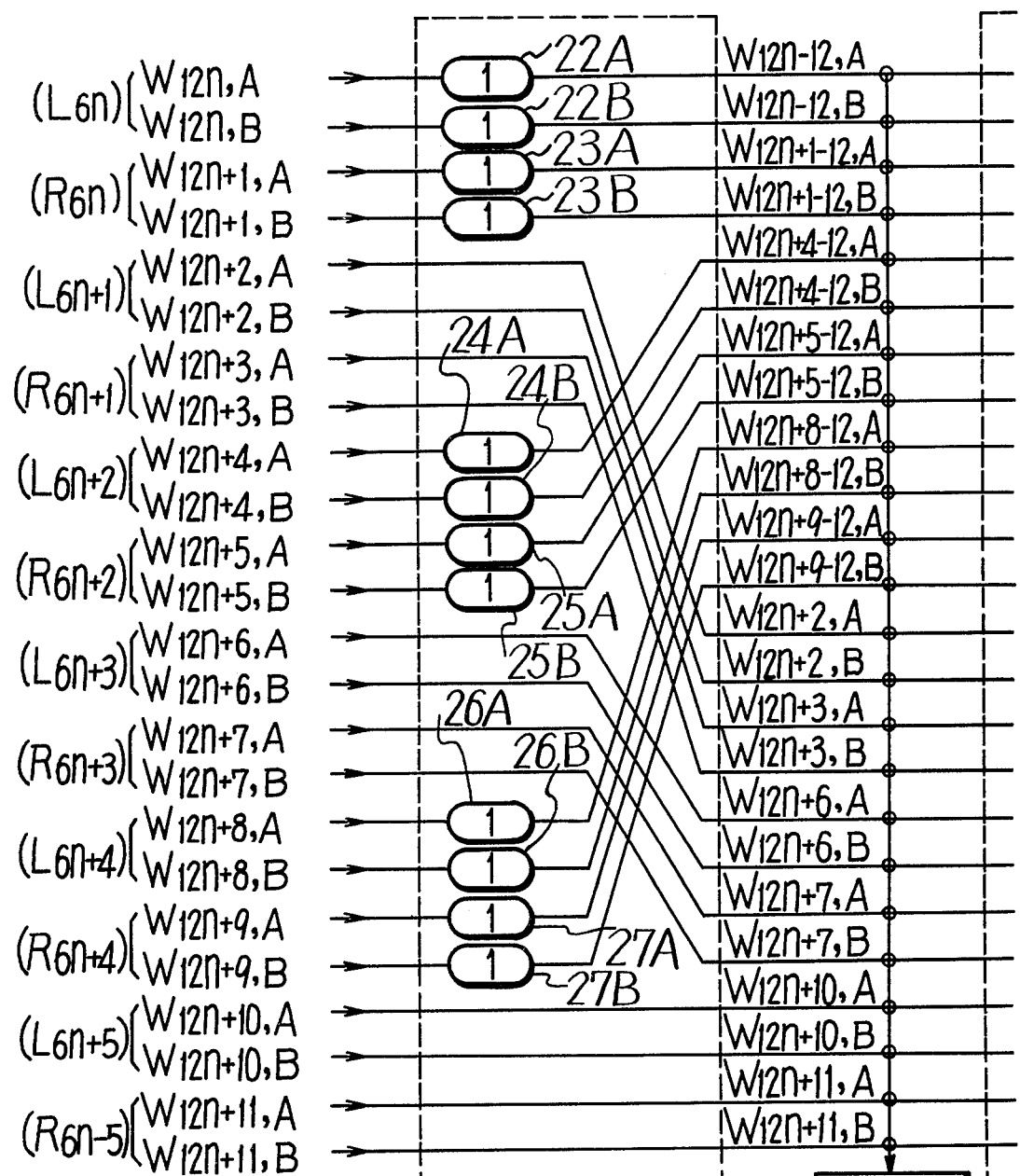
FIG. 2 (formed of FIGS. 2A and 2B together) is a block diagram showing an example of an error correcting encoder to which the present invention is applied.
Figure 2B:
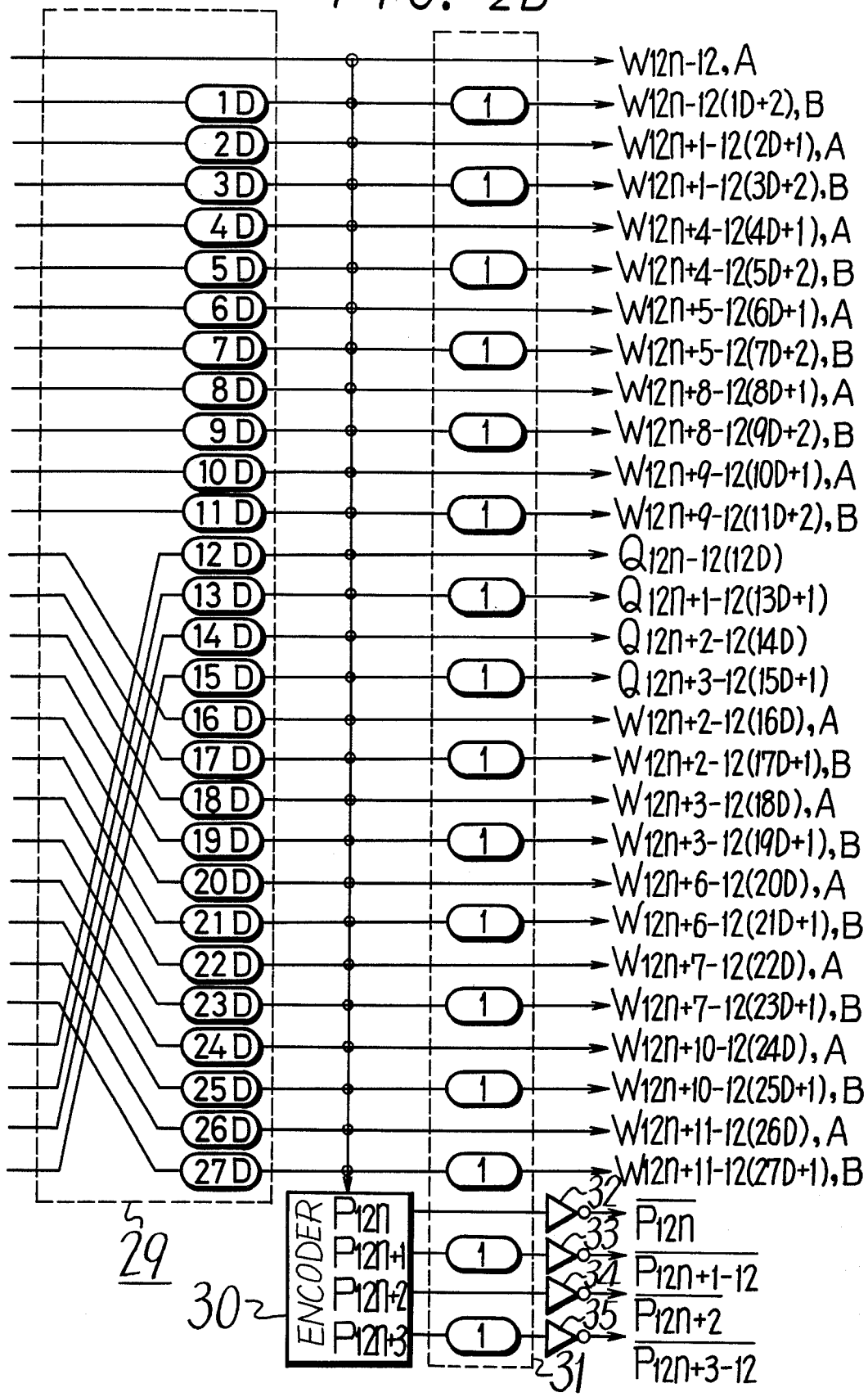

FIG. 2 shows, as a whole, an error correcting encoder provided in the recording system to which is supplied an audio PCM signal as an input signal. To provide this audio PCM signal, left and right stereo signals are respectively sampled at a sampling frequency $f_s$ (for example, 44.1 KHz) and each sampled value is converted into one digital word (which, for example, is encoded as a complement-of-two and has a length of 16 bits). Accordingly, for the left channel of the audio signal there are obtained PCM data words $L_0$, $L_1$, $L_2$ ... and for the right channel there are obtained PCM data words $R_0$, $R_1$, $R_2$ .... The PCM data words of the left and right channels are each separated into six channels, and hence a total of twelve channels of PCM data sequences are input to the error correcting encoder. At any given point in time, twelve words, such as $L_{6n}$, $R_{6n}$, $L_{6n+1}$, $R_{6n+1}$, $L_{6n+2}$, $R_{6n+2}$, $L_{6n+3}$, $R_{6n+3}$, $L_{6n+4}$, $R_{6n+4}$, $L_{6n+5}$ and $R_{6n+5}$, are input into the encoder. In the illustrated example, each word is divided into an upper eight bits and lower eight bits, and hence the twelve channels are processed as twenty-four channels. For the sake of simplicity, each on word of the PCM data is expressed as $W_i$, its upper eight bits are expressed as $W_i$, A and its lower eight bits are expressed as $W_i$, B. For example, the word $L_{6n}$ is divided into two words, $W_{12n}$, A and $W_{12n}$, B.

The PCM data sequences of twenty-four channels are first applied to an even-and-odd interleaver 21. If n is an integer 0, 1, 2 ..., the words $L_{6n}$ (i.e., $W_{12n}$, A and $W_{12n}$, B), $R_{6n}$ (i.e., $W_{12n+1}$, A and $W_{12n+1}$, B), $L_{6n+2}$ (i.e., $W_{12n+4}$, A and $W_{12n+4}$,B), $R_{6n+2}$ (i.e., $W_{12n+5}$, A and $W_{12n+5}$,B), $L_{6n+4}$ (i.e., $W_{12n+8}$,A and $W_{12n+8}$,B), and $R_{6n+4}$ (i.e., $W_{12n+9}$, A and $W_{12n+9}$,B) are respectively even-order words and the remaining words are respectively odd-order words. The PCM data sequences consisting of even order words are respectively delayed through one word delay circuits or lines 22A,22B,23A,23B,24A,24B,25A,25B,26A,26B,27A and 27B of the even-and-odd interleaver 21. It is of course possible to delay words larger than one word, for example, eight words. Further, in the even-and-odd interleaver 21, the twelve data sequences consisting of even-order words are converted or shifted so as to occupy the first to twelfth transmission channels and twelve data sequences consisting of odd-order words are converted so as to occupy the thirteenth to twenty-fourth transmission channels, respectively.

The even-and-odd interleaver 21 serves to prevent more than two continuous words of the respective left and right stereo signals from developing errors, in which case the errors become substantially impossible to correct.

To explain the benefit of this feature, three continuous words $L_{i-1}$, $L_i$, and $L_{i+1}$ will be considered as an example. When the word $L_i$ is erroneous and it is not correctable, it is most desirable that both the surrounding words $L_{i-1}$ and $L_{i+1}$ be correct. The reason for this is that in order for an uncorrectable erroneous word $L_i$ to be compensated, $L_i$ is interpolated between the preceding correct word $L_{i-1}$ and the following correct word $L_{i+1}$, usually by taking the mean value of $L_{i-1}$ and $L_{i+1}$. The delay lines 22A,22B, ... 27A and 27B of the even-and-odd interleaver 21 are provided so that adjacent words will be placed in different error correcting blocks. Further, the reason for gathering together groups of transmission channels for the even-order words and the odd-order words is that when the data sequences are interleaved, the distance between the recording positions of the adjacent even and odd order words should be as great as possible.

At the output of the even-and-odd interleaver 21, the words of the twenty-four channels appear in a first arrangement state. From the interleaver 21 respective PCM data words are applied word by word to an encoder 28 which then generates first check words $Q_{12n}$, $Q_{12n+1}$, $Q_{12n+2}$, and $Q_{12n+3}$, as shown by p, q, r, s in the expression given above.

An error correcting block including the first check words then occurs as follows:

$(W_{12n-12}A; W_{12n-12}B; W_{12n+1-12}A; W_{12n+1-12}B;$ $W_{12n+4-12}A; W_{12n+4-12}B; W_{12n+5-12}A; W_{12n+5-12}B;$ $W_{12n+8-12}A; W_{12n+8-12}B; W_{12n+9-12}A; W_{12n+9-12}B;$ $W_{12n+2}A; W_{12n+2}B; W_{12n+3}A; W_{12n+3}B;$ $W_{12n+6}A; W_{12n+6}B; W_{12n+7}A; W_{12n+7}B;$ $W_{12n+10}A; W_{12n+10}B; W_{12n+11}A; W_{12n+11}B;$ $Q_{12n}; Q_{12n+1}; Q_{12n+2}; Q_{12n+3})$

The first encoder 28 carries out its function by calculating the first check words $Q_{12n}$ to $Q_{12n+3}$ according to the number of words of one block (n=28); the bit length m of each word (m=8); and the number of the check words (k=4).

The twenty-four PCM data word sequences and the four check word series are then applied to an interleaver 29. In this interleaver 29, the relative positions of the channels are changed such that the check word series are located between the PCM data sequences consisting of the even order words and the PCM data sequences consisting of the odd order words, and thereafter a delay process is performed for these interleaving sequences. This delay process is carried out on twenty-seven transmission channels, beginning with the second transmission channel, by delay lines with delay amounts of 1D, 2D, 3D, 4D, . . . 26D, and 27D, respectively (where D is a unit delay amount, for example, four words).

At the output of the interleaver 29, twenty-eight sequences of data words appear in a second arrangement state. The data words are taken word by word from the respective data sequences and these words are fed to an encoder 30 which then produces second check words $P_{12n}$, $P_{12n+1}$, $P_{12n+2}$ and $P_{12n+3}$ in the same manner as the check words $Q_{12n}$ to $Q_{12n+3}$.

Just as the above encoder 28 provides the above first check words according to the parameters n=28, m=8, and k=4, the similar encoder 30 provides the second check words according to the parameters n=32, m=8, and k=4.

An error correcting block including the second check words and consisting of thirty-two words is formed as follows:

$(W_{12n-12}A; W_{12n-12(D+1)}B; W_{12n+1-12(2D+1)}A;$ $W_{12n+1-12(3D+1)}B;$ $W_{12n+4-12(4D+1)}A; W_{12n+4-12(5D+1)}B;$ $W_{12n+5-12(6D+1)}A; W_{12n+5-12(7D+1)}B; \ldots ;$ $Q_{12n-12(12D)}; Q_{12n+1-12(13D)}; Q_{12n+2-12(14D)};$ $Q_{12n+3-12(15D)}; \ldots W_{12n+10-12(24D)}A;$ $W_{12n+10-12(25D)}B; W_{12n+11-12(26D)}A;$ $W_{12n+11-12(27D)}B; P_{12n}; P_{12n+1}; P_{12n+2}; P_{12n+3}).$ An interleaver 31 is provided thereafter, and includes delay lines of one word delay amount for the even order transmission channels of the thirty-two data sequences including the first and second check words, and inverters 32, 33, 34 and 35 are provided for inverting the second check word series. The interleaver 31 serves to prevent errors occurring over the boundary between the blocks from affecting so many words that it is impossible to correct them. The inverters 32, 33, 34, and 35 serve to prevent misoperation when all the data in one block are made "0" by the occurrence of drop out during transmission. That is to say, if drop out does occur, the inverted check word series will be discriminated correctly in the reproducing system. For the same purpose, inverters may be provided for the first check word series.

The finally-derived twenty-four PCM data sequences and eight check word series are serialized as thirty-two-word blocks and a synchronizing signal of sixteen bits is added to the resulting serial data at the head thereof to form one transmission block as shown in FIG. 3. The block thus made is transmitted on a transmission medium or carrier. In the block of data shown in FIG. 3, the word provided from the ith transmission channel would be represented by $U_i$.

Practical examples of the transmission medium, or carrier, for the transmitted signal can include magnetic tape for use in magnetic recording and reproducing apparatus, a disc for use in a rotary disc apparatus, or other similar medium.

In the above transmission state, when the synchronizing signal is neglected, the distance between the words included in the same first error correcting block (i.e. twenty-four words supplied to the encoder 28) must be considered. As will be clear by taking, for example, words $W_{12n-2}$, A and $W_{12n-12}$, B into consideration, the distance between adjacent words included in the first error correcting block becomes $12(D+1)$ words. However, since the check words $Q_{12n}$, $Q_{12n+1}$, $Q_{12n+2}$ and $Q_{12n+3}$ provided by the encoder 28 are inserted into the data words of twenty-four words, the distance between the words $W_{12n+9-12}$,B and $W_{12n+2}$,A becomes five times that of $12(D+1)$. Accordingly, if a burst error exceeding the $12(D+1)$ appears in the transmission path, more than two words adjacent in each of twelve words of $W_{12n-12}$,A, $W_{12n-12}$,B . . . $W_{12n+9-12}$, B and twelve words of $W_{12n+2}$,A, $W_{12n+2}$,B, . . . $W_{12n+11}$,B become error words. When more than two adjacent words, for example, four words are detected as error words, the error correction in the case of the error locations being known is carried out for the four word errors. In general, in the case where the error detection and error correction are performed at every block consisting of a plurality of words, if an error detecting code is not added at every word, when error correction is impossible because more than a given number of error words exist in the same error correction block, other words are also assumed to include an error. In practice, when the error correction in the case of the error location being known is achieved for M words which, though not including any error are deemed as error words due to the operation of the error correcting code, the words which were corrected become abnormal. However, by utilizing such a property that, upon transmitting words through the interleaver, random errors in the transmission path become relatively remote from another after the de-interleave operation, if the above correction is performed for only the adjacent error words, the fear that erroneous error correction is carried out can be reduced. In addition, by utilizing the error location becoming i, i+1, i+2 and i+3, the structure for error correction can be simplified.

The present invention will be described further. The reproduced data thirty-two words $U_1$ to $U_{32}$ at a time constituting a block of the transmitted signal, are applied to the input of an error correcting decoder shown in FIG. 4. The transmitted data as received at the error correcting decoder may contain one or more errors since the input data are reproduced data. If there is no error, the thirty-two words fed to the input of the decoder coincide with the thirty-two words appearing at the output of the error correcting encoder. At the error correcting decoder a de-interleave process complementary to the corresponding interleave process at the encoder is performed to return the data to its original order. If there is an error, the error correcting process is carried out after the data are restored to the origital order.

Figure 4A:
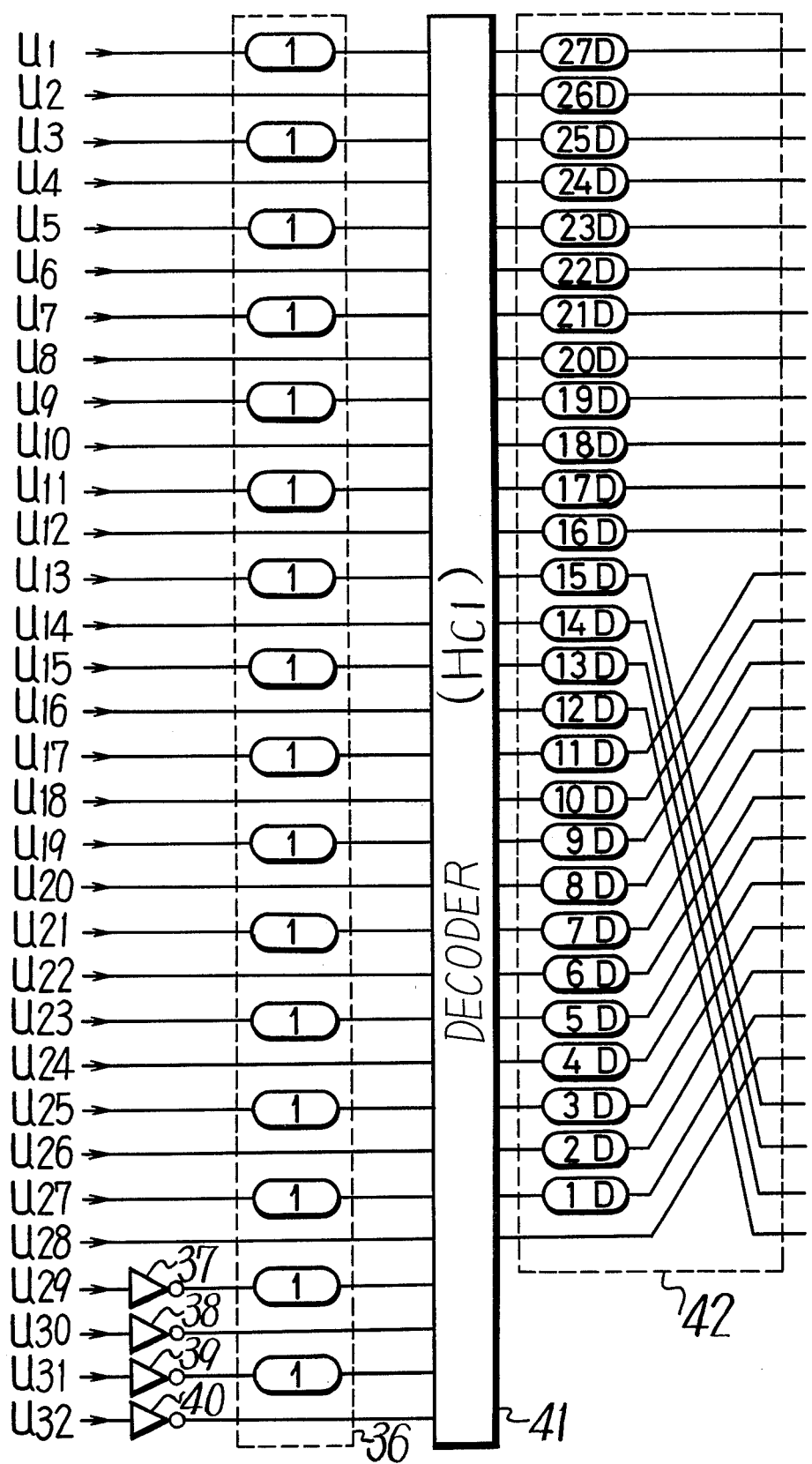
FIG. 4 (formed of FIGS. 4A and 4B together) is a block diagram showing an example of an error correcting decoder to which the present invention is applied.
Figure 4B:
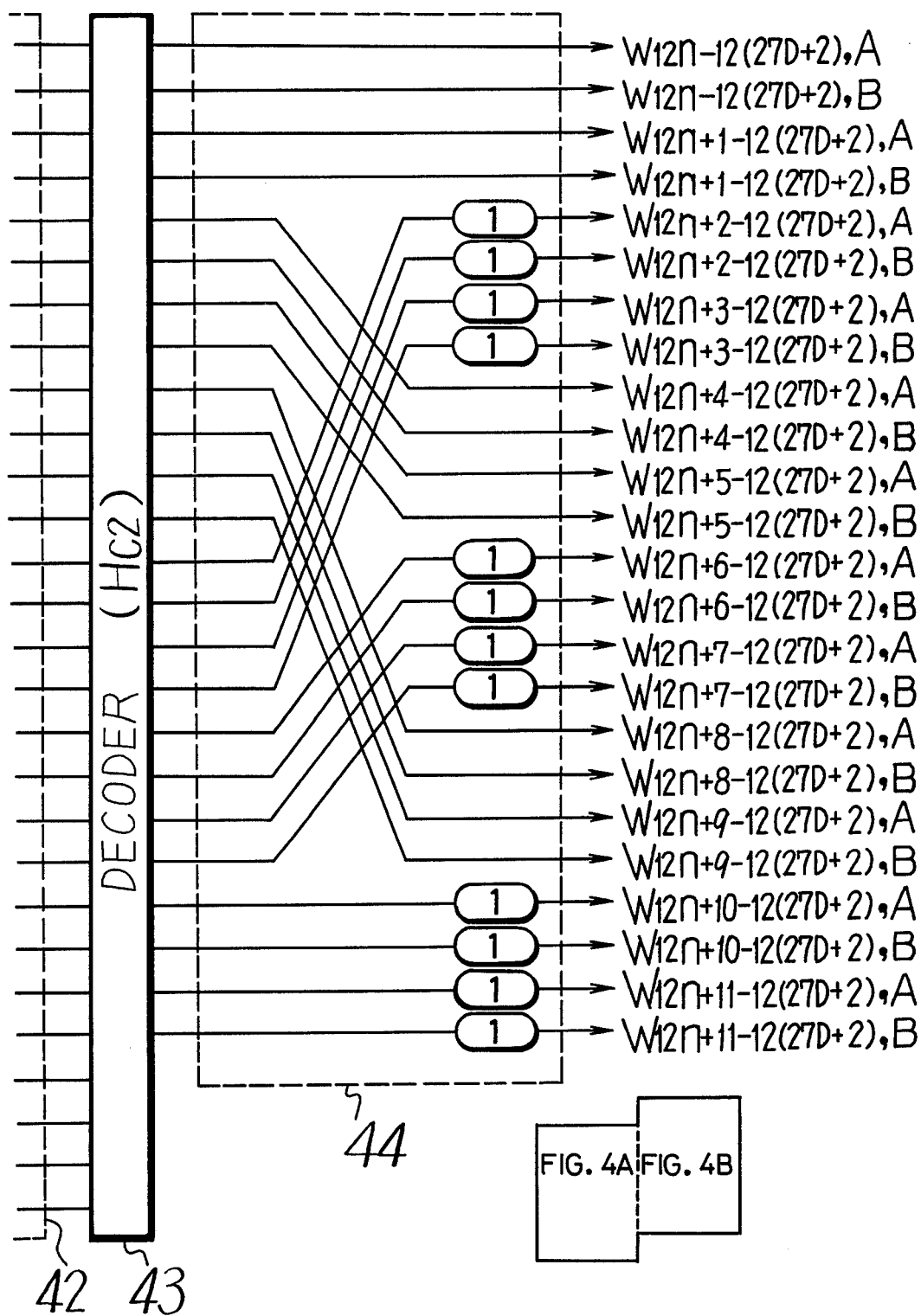

Initially, as shown in FIG. 4, a de-interleaver 36 is provided in which delay lines, each having a delay amount of one word, are provided for the odd order transmission channels, and inverters 37, 38, 39, and 40 are provided for inverting the received second check word series. The outputs from the de-interleaver 36 and the inverters 37 to 40 are coupled to a first decoder 41. In this first decoder 41, syndromes $S_{10}$, $S_{11}$, $S_{12}$, and $S_{13}$ are generated according to a matrix, such as the Reed-Solomon parity detection matrix $H_{C1}$ (FIG. 5) by the thirty-two input words $V^T$ as shown in FIG. 5, and the above-mentioned error correction is performed based upon the syndromes $S_{10}$ to $S_{13}$. In FIG. 5, $\alpha$ is an element of $GF(2^8)$ and a root of $F(x)=x^8+x^4+x^3+x^2+1$. The decoder 21 derives the corrected twenty-four PCM data sequences and four first check word series. At every individual word of the data sequences, a pointer, or error detecting code, (at least one bit) is added to indicate whether there is an error in the associated word (pointer is "1") or not (pointer is "0"). In FIG. 5 and FIG. 6 and also in the following description, the received one word $\hat{W}i$ will be referred to merely as Wi.

The output data sequences from the decoder 41 are applied to a de-interleaver 42 which serves to compensate for the delay process performed by the interleaver 29 in the error correcting encoder, and has corresponding delay lines with respective different delay amounts of 27D, 26D, 25D, . . . 2D, and 1D provided for the first to twenty-seventh transmission channels. The output from the de-interleaver 42 is applied to a second decoder 43 in which syndromes $S_{20}$, $S_{21}$, $S_{22}$ and $S_{23}$ are generated according to a matrix, such as the Reed-Solomon parity detection matrix $H_{c2}$ (FIG. 6). The twenty-eight words $V_T$ as shown in FIG. 6 are applied thereto and the above-mentioned error correction is carried out based upon the syndromes $S_{20}$ to $S_{23}$.

The decoder 43 clears the pointer relating to each word whose error is corrected, but does no clear the pointer relating to any word whose error cannot be corrected.

The data sequences appearing at the output of the decoder 43 are applied to an even-and-odd de-interleaver 44, in which the PCM data sequences consisting of the even-order words and the PCM sequences consisting of the odd-order words are rearranged so that they are positioned at alternative transmission channels, and delay lines of one word delay amount are provided for the PCM data sequences consisting of the odd-order words. This compensates for the corresponding operation performed in the encoder prior to transmission. At the output of the even-and-odd de-interleaver 44, there are provided the PCM data sequences which have the original arrangement state and predetermined order restored entirely to that of the digital signal before it was acted upon by the error correcting encoder.

Although not shown in FIG. 4, a compensating circuit is preferably provided at the next stage following the even-and-odd de-interleaver 44 to compensate for uncorrectable errors. For example, a mean-value interpolation can be used whenever errors are not corrected by the decoders 41 and 43, so that any remaining errors are masked and made inconspicuous.

In order to effectively exhibit the high error correcting ability of the error correcting code, when the first decoding is performed, a pointer which will indicate whether or not there is an error is added at every word, the state of the pointer is detected at the second decoding, and the error correction will be carried out by using the detected result. At the same time, when the data are transmitted through the interleave process and the de-interleave process to return the data to the second arranging state is performed to carry out the second decoding, the error is detected based upon whether the pointer is in a specific state or not and errors are corrected up to M words at maximum. In other words, the interleave and de-interleave operations serve to disperse the burst errors generated in the transmission path and to prevent the number of error words in one error correcting block from being increased to such a number which can not be corrected. However, when the period of the burst error becomes long, there may occur such a case that a plurality of words adjacent one another in the error correcting block obtained by the de-interleave operation include an error.

Only when the specific error can be known by the state of the pointer, if the error correction is performed for the plurality of error words, can the undesired possibility of erroneous error correction be reduced as compared with the case where the error correction is carried out by using the error location represented only at the pointer.

In the example shown in FIG. 4, one word error is corrected by the first decoder 41. When it is detected that more than two word errors exist in one error correcting block, the pointer of at least one bit is added to all of twenty-eight words of the error correcting block, i.e., to all words of the thirty-two word block except the check words, to indicate the existence of errors as set forth above. This pointer is "1" when there is an error but "0" when there is no error. In the case where one word consists of eight bits, the pointer is added as one bit higher than MSB so that one word is made to consist of nine bits. Then, the words are processed by the deinterleaver 42 and thereafter fed to the second decoder 43.

In this decoder 43, the error is corrected by using the number of error words in the first error correcting block indicated by the pointer or error location.

Figure 7:
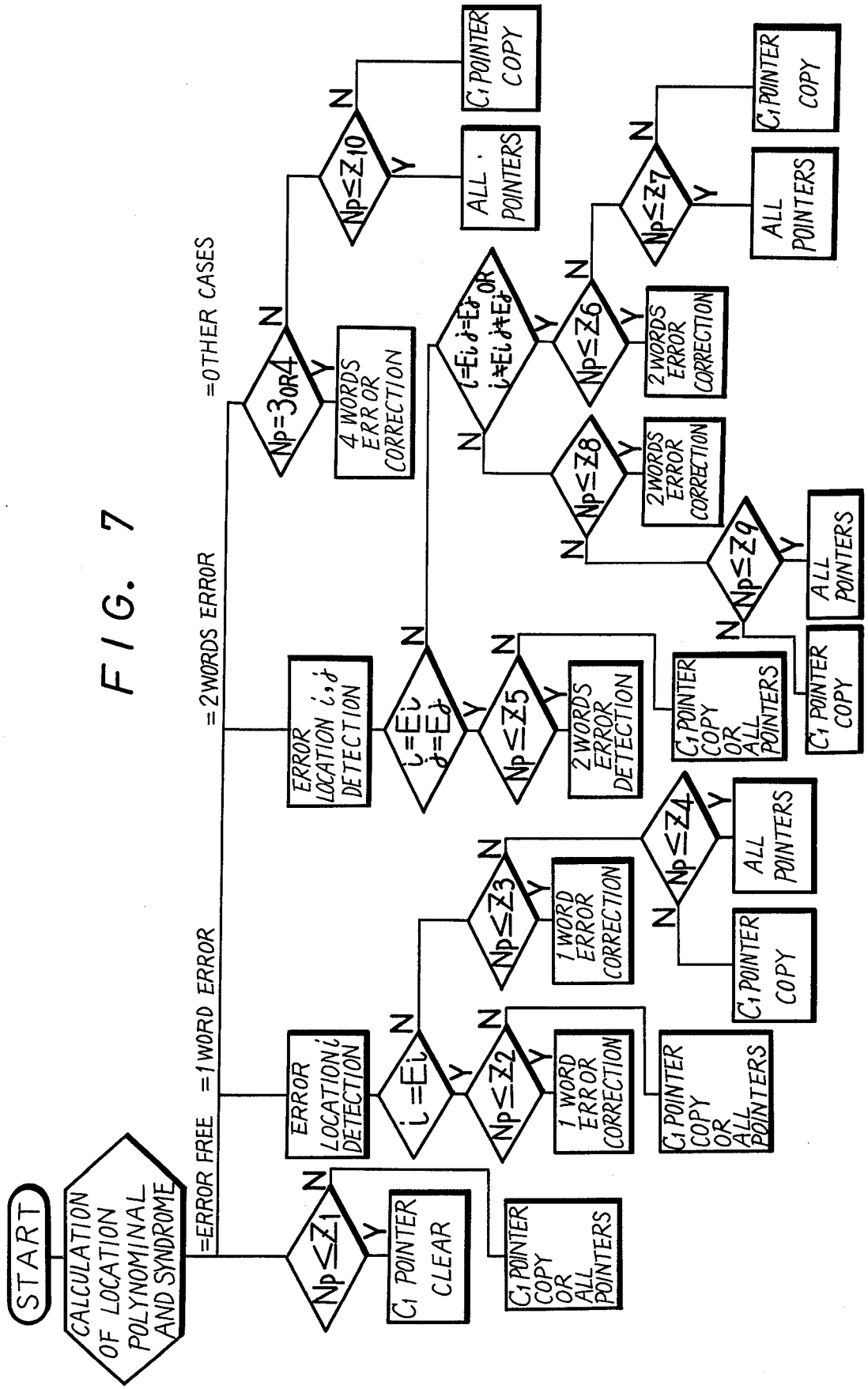

FIG. 7 is a chart showing an example of the error correction operation carried out by the second decoder 43. In FIG. 6 and the following description thereof, the number of erroneous words by the pointers is expressed by $N_P$ and the error location by the pointers is expressed by $E_i$. Further, in FIG. 7, Y represents "yes" and N represents "no".

Since two word errors are corrected at the second decoder 43, the modified error correcting algorithm is desired as the error correcting algorithm. In other words, at the beginning of the flow chart shown in the figure, the previously-mentioned error location equation $A\alpha^{2i}+B\alpha^{i}+C=0$ is calculated and the error correction is performed by using the constants A, B, and C of the above polynominal and the syndromes $S_{20}$ to $S_{23}$. At the same time, the total number $N_P$ of the pointers representing errors contained in one block is checked. It is of course possible to use the fundamental algorithm in which, by using the syndrome, the existence of no error is detected, one word error is detected and then two word errors are detected in a step manner.

(1) The existence of error or not is examined. When $A=B=C=0$, $S_{20}=0$, and $S_{23}=0$, it is generally decided that there is no error. At this time, whether or not $N_p \leq z_1$ is satisfied is examined. If $N_P \leq z_1$, it is judged that there is no error, and then the pointer in the error correcting block is cleared (i.e., is made "0"). If, on the contrary, $N_P > z_1$, the error detection by the syndromes is judged incorrect and the pointer is left unchanged or, alternatively, pointers for all words in the block are made "1". In this case, the value of $z_1$ is selected to be relatively large, for example, 14.

(2) It is checked whether or not an error is one word error. When $A=B=C=0$, $S_{20}\neq 0$, and $S_{23}\neq 0$, the error is generally judged as one word error, and the error location i is obtained from $S_{21}/S_{20}=\alpha^i$. It is detected whether or not the error location i coincides with that indicated by the pointer. When the plural error locations are indicated by the pointers, it is examined whether the error location i coincides with any of them or not. If i=Ei, it is then examined whether $N_P \leq z_2$ or not, where $z_2$ is, for example, 10. If $N_P \leq z_2$, the error is judged as one word error and then one word error is corrected by using $e_i=S_{20}$. If $N_P > z_2$ even though i=Ei, there is a risk that the error is misjudged as one word error, because the number of the pointers is too large for one word error. Therefore, the pointers are left unchanged, or all the words are deemed erroneous and then the respective pointers thereof are made "1".

In the case of i≠Ei, it is checked whether $N_P \leq z_3$ is satisfied or not, where $z_3$ is a rather small value, for example, 3. When $N_P \leq z_3$ is established, one word error at the error location i is corrected by the calculation of the syndrome.

In the case of $N_P > z_3$, it is further checked whether $N_P \leq z_4$ is satisfied or not. When $z_3 < N_P \leq z_4$, it means that although the judgment of one word error by the syndrome is erroneous, $N_P$ is too small. Therefore, in this case the pointers for all words of the block are made "1". On the contrary, in the case of $N_P > z_4$, the pointers are left unchanged.

(3) It is checked whether or not an error is two word errors. When the error is two word errors, the error locations i and j are detected by calculation. If $A \neq 0$, $B \neq 0$, $C \neq 0$ and $D^2/E = \alpha^{-t} + \alpha^t$ where t=1 to 27, the error is judged as two word errors and the error locations i and j are obtained by $\alpha^i = D/X$ and $\alpha^j = D/Y$. It is detected whether or not the error locations i and j coincide with those Ei and Ej indicated by the pointers. When i=Ei and j=Ej, the number $N_P$ of the pointers representing errors is compared with a predetermined value $z_5$. If $N_P \leq z_5$, two word errors relating to the error locations i and j are corrected. This correction is carried out by obtaining the error patterns ei and ej as set forth previously. $N_P > z_5$, no correction is performed under the assumption that, for example, more than three word errors are erroneously detected as two word errors, and the pointers are remained unchanged or all the words in the block are judged erroneous.

When one of the error locations i and j coincides with one of the error locations Ei and Ej, i.e., i=Ei, j≠Ej or i≠Ei, j=Ej, it is checked whether or not $N_P \leq z_6$ is satisfied. When $N_P \leq z_6$, two word errors relating to the error locations i and j are corrected. When $N_P > z_6$, it is checked whether $N_P \leq z_7$ is satisfied or not. This check is such that when the error locations are partially coincident, the number of pointers representing errors is checked to see if it is large or small. If $N_P \leq z_7$, it is judged that the number of the pointers is too small and the pointers of all words in the block are made "1". However, if $N_P > z_7$, the reliability of the pointers may be considered high so that the pointers are held unchanged.

When i≠Ei and j≠Ej, it is checked whether or not $N_P \leq z_8$. If $N_P$ is rather small, the result obtained by using the error location equation is considered more significant than the pointers and two word errors relating to the error locations i and j are corrected. When $N_P > z_8$, it is further checked whether or not $N_P \leq z_9$ is satisfied. This check is similar to that of $N_P \leq z_7$ to leave the pointers of the block unchanged or make the pointers of all the words of the block "1".

(4) In the case which is different from any of the above cases (1), (2) and (3), namely where there are more than two word errors, it is checked whether $N_P = 3$ or $N_P = 4$ or not and three words or four words are adjacent in each twelve words of data words of twenty-four words in the first error correcting block or not. Only when the above is established, three word errors relating to the error locations represented by the pointers are corrected. In this case, since the error words are adjacent, the error locations become i, i+1, i+2 and i+3. Thus, the error pattern can be obtained by the calculation which is much simplified as compared with the calculation relating to the four words error correction. This will be described as follows:

$$e_i = \alpha^{218}S_{20} + \alpha^{158}\alpha^{-i}S_{21} + \alpha^{156}\alpha^{-2i}S_{22} + \alpha^{212}\alpha^{-3i}S_{23}$$

$$e_{i+1} = \alpha^{158}S_{20} + \alpha^{138}\alpha^{-i}S_{21} + \alpha^{2}\alpha^{-2i}S_{22} + \alpha^{153}\alpha^{-3i}S_{23}$$

$$e_{i+2} = \alpha^{156}S_{20} + \alpha^{2}\alpha^{-i}S_{21} + \alpha^{135}\alpha^{-2i}S_{22} + \alpha^{152}\alpha^{-3i}S_{23}$$

$$e_{i+3} = \alpha^{212}S_{20} + \alpha^{153}\alpha^{-i}S_{21} + \alpha^{152}\alpha^{-2i}S_{22} + \alpha^{209}\alpha^{-3i}S_{23}$$

Further, when $N_P = 3$ and the error locations of three word errors are i, i+1, and i+2, a dummy error is added to the word with the error location of i+3, this word is then deemed as an error word and the error words are processed as four word errors.

(5) In the case which is different from any one of the above cases (1), (2), (3), and (4), no error correction is carried out. In this case, it is checked whether or not $N_P \leq z_{10}$ is satisfied. When $N_P \leq z_{10}$, the reliability of the pointers is judged low and the pointers of all the words are made "1". When $N_P > z_{10}$, the pointers are left unchanged.

Further, the value zi, which is compared with the total number $N_P$ of pointers representing the errors in one block, is set as a suitable value in consideration of probability of generation of erroneous detection due to the error correcting code (in the above example, when an error is more than or equal to five word errors, there is a risk that the above error is judged as no error, when an error is more than or equal to four word errors, this error may be judged as one word error, and when an error is more than three word errors, this or equal to error may be judged as two word errors).

As aforesaid, following the above-mentioned decoding process, the words identified by pointers as being erroneous are compensated as uncorrectable.

In the error correcting decoder shown in FIG. 4, error correction using the first check words $Q_{12n}$, $Q_{12n+1}$, $Q_{12n+2}$ and $Q_{12n+3}$ and error correction using the second check words $P_{12n}$, $P_{12n+1}$, $P_{12n+2}$ and $P_{12n+3}$ are each carried out one time. However, if the above error corrections are respectively carried out two times or more (in practice, about two times), the error correcting ability can be increased considerably, since the corrected result is each time less in error. As set forth above, in the case where a decoder is provided further in the latter stage, it is necessary that the check word is corrected in the decoders 41 and 43.

In the above example, in the delay process in the interleaver 29, the delay amount differs from one channel to the next by a constant amount of variation D, but it is also possible to employ an irregular variation in delay amount rather than the above constant variation. Further, the second check words Pi are such error correcting codes which are formed not only from the PCM data words but also the first check words Qi. Similarly, it is possible that the first check words Qi are formed from words including the second check word Pi. To this end, a feedback technique can be employed so that the second check words Pi are fed back to the encoder which produces the first check words.

The above feedback technique is effective in the case where the number of decodings is selected more than three times.

Further, it may be possible that up to two word errors are corrected at the first decoder 41. However, as in the above embodiment, by the fact that although two word errors can be corrected at the first decoder, only one word error is corrected at the first decoder, such a fear that an erroneous error detection or erroneous error correction is caused in the decoder can be reduced. In this case, two word errors are corrected in the second decoder so that the error correcting ability is not so lowered. In addition, since the error correction by calculating the syndromes is limited to one word error, the construction of the first decoder can be simplified much.

Further, even when one word error is corrected in the first decoder, if the pointer for each word in the block in which the corrected word is included is made "1", the error detection can be performed more correctly and hence the fear of erroneous correction can be reduced.

As will be understood from the above description, the burst errors are dispersed by the cross-interleave technique, so that the error correction can be effectively performed for both random and burst errors.

Further, only when error words, whose number is similar to the number of the adjacent M words included in the first error correcting block upon the de-interleave operation, are detected by the pointers is, the error correction performed to the error locations represented by the pointers. Therefore, the fear of erroneous error correction can be reduced as compared with the case where the error correction is performed by merely using the error locations indicated by the pointers and hence the error correcting ability can be improved.

The present invention can be applied with good effect to a digital audio disc system having the similar theory as that of a video disc system which can be constructed as a reproducing apparatus separate from the error correcting encoder.

It will be apparent that many modifications and variations could be effected by one skilled in the art without departing from the spirit or scope of the present invention, which is to be determined by the appended claims.

We claim as our invention:

1. A method for use in detecting and correcting errors in received digital data signals formed of data words and error check words, comprising the steps of:
   generating a plurality of signals representative of error syndrome words by multiplying a block of received data signals with a parity check matrix;
   generating a plurality of signals representative of error constant words from said plurality of generated signals representative of error syndrome words;
   determining whether errors exist in said received digital data signals by checking preselected equalities or inequalities among said generated signals representative of error syndrome words and said generated signals representative of error constant words and producing indication signals representative of the existence of such errors;
   generating error pattern signals using said signals representative of error syndrome words and said signals representative of said error constant words for locating any indicated errors in response to said indication signals representative of the existence of errors; and
   correcting located errors in the received digital data signals using said generated error pattern signals.

2. A method for use in detecting and correcting errors according to claim 1, including the steps of selecting ones of said signals representative of error syndrome words and ones of said signals representative of error constant words to have a zero signal level, determining whether said zero signal levels are present, and declaring that no error words are detected.

3. A method for use in detecting and correcting errors according to claim 1, including the steps of selecting ones of said signals representative of error syndrome words to have a nonzero signal level, selecting ones of said signals representative of error constant words to have a zero signal level, determining whether said respective zero and nonzero signal levels are present, and declaring the presence of one word error for correction in accordance with said error pattern signal.

4. A method for use in detecting and correcting errors according to claim 1, including the steps of selecting ones of said signals representative of error constant words to have nonzero signal levels, determining whether said nonzero signal levels are present, declaring the presence of two words error, generating a second plurality of signals representative of error constant words, and solving an error location equation using said second plurality of signals representative of error constant words to produce said error pattern signals for correcting said two words error.

5. A method for use in detecting and correcting errors according to claim 4, in which the step of generating a plurality of signals representative of error syndrome words includes the step of k syndrome words, $S_0$ to $S_{k-1}$, by multiplying one block $V^T$ consisting of n received words by a parity check matrix H $$H \cdot V^T = \begin{bmatrix} S_0 \\ S_1 \\ \cdot \\ \cdot \\ \cdot \\ S_{k-2} \\ S_{k-1} \end{bmatrix}$$

where the parity check matrix H has n columns and k rows, and in which each element of one predetermined row is selected from $\alpha^0 (=1)$ to $\alpha^{2m-2}$, $\alpha$ being a root to satisfy $F(x)=0$ when $F(x)$ is an irreducible polynomial on Galois field GF(2), so that the same value does not appear twice in said predetermined row, and wherein the elements in the remaining rows are selected to be a given power, for all the elements in each respective row, of the corresponding elements in said predetermined row.

6. A method for use in detecting and correcting errors according to claim 5, in which the step of generating a plurality of signals representative of error constant words includes the further steps of obtaining error constant words A, B, and C utilizing said syndromes, so that:

$$\begin{bmatrix} A_1 = S_0 S_2 + S_1^2 \\ B_1 = S_1 S_2 + S_0 S_3 \\ C_1 = S_1 S_3 + S_2^2 \end{bmatrix}$$

$$\begin{bmatrix} A_2 = S_1 S_3 + S_2^2 \\ B_2 = S_2 S_3 + S_1 S_4 \\ C_2 = S_2 S_4 + S_3^2 \end{bmatrix}$$

$$\cdot$$
$$\cdot$$
$$\cdot$$

$$\begin{bmatrix} A_{k-3} = S_{k-4} S_{k-2} + S_{k-3}^2 \\ B_{k-3} = S_{k-3} S_{k-2} + S_{k-4} S_{k-1} \\ C_{k-3} = S_{k-3} S_{k-1} + S_{k-2}^2 \end{bmatrix}$$

7. A method for use in detecting and correcting errors according to claim 6, in which said step of determining whether preselected equalities or inequalities are satisfied includes the steps of determining:

(a) when $S_0 = S_3 = S_4 = \ldots = S_{k-1} = 0$, $A_1 = A_2 = \ldots = A_{k-3} = 0$, $B_1 = B_2 = \ldots = B_{k-3} = 0$, and $C_{k-3} = 0$ are satisfied and producing a signal indicating that there is no error word, (b) when $S_0 \neq 0$, $S_3 \neq 0$, $S_4 \neq 0$, ..., $S_{k-1} \neq 0$, $A_{k'} = 0$, $B_{k'} = 0$, where $k' = 1$ to $k-3$ and $C_{k-3} = 0$ are satisfied, and producing a signal indicating that there is one word error, and (c) when $A_{k'} \neq 0$, $B_{k'} \neq 0$ and $C_{k-3} \neq 0$ are satisfied and $$\left( \frac{B_1}{A_1} = \frac{B_2}{A_2} = \ldots = \frac{B_{k-3}}{A_{k-3}} = D \right)$$
$$\left( \frac{C_1}{A_1} = \frac{C_2}{A_2} = \ldots = \frac{C_{k-3}}{A_{k-3}} = E \right)$$

and producing a signal indicating that there are two words in error.

8. A method for use in detecting and correcting errors according to claim 7, in which the step of correcting located errors includes the further steps of generating error location equation $\alpha^{2i}+D\alpha^i+E=0$ and solving same to detect error locations i and j so that two word errors are corrected.

9. A method for use in detecting and correcting errors in received coded digital data signals which include a number of check words added to the coded data signals prior to transmission thereof, comprising the steps of:
generating a number of signals representative of error syndrome words equal to the number of error check words contained within the transmitted data signal by multiplying a block of the received digital data signals by a parity check matrix;
generating a plurality of signals representative of error constant words from said plurality of signals representative of error syndrome words;
determining whether the generated signals representative of error syndrome words all have a zero signal level and upon such determination declaring that there is no error in the received digital data signals;
determining whether all generated signals representative of error syndrome words have a nonzero signal level and upon such nonzero signal level determination declaring that at least one word error is present in the received digital data signals;
determining that not more than two words error are present;
generating error pattern signals using said generated signals representative of error syndrome words and said generated signals representative of error constant words for indicating the locations of word errors;
correcting the one or two words error present using said error pattern signals;
determining whether three or four words error are present;
indicating the location of the three or four words error by setting pointers associated therewith; and
correcting the errors indicated by the pointers.

10. A method for use in detecting and correcting errors according to claim 9, including the steps of establishing ratios between selected ones of said generated signals representative of error syndrome words, selecting a pattern of elements in the parity check matrix, memorizing the selected pattern of elements of the parity check matrix in a read only memory, and comparing the established ratios of signals representative of error syndrome words with the memorized pattern to determine the location of one word error, and generating the error pattern signals to be equal to the first one of said generated signals representative of error syndrome words.

11. A method for use in detecting and correcting errors according to claim 9, in which the step of correcting the one or two words error includes the steps of determining that two words are in error, selecting relationships between the signals representative of error syndrome words and an error pattern signal specific to each of the two words error, determining the error pattern signals specific to each error word based upon a selected relationship between first and second ones of said generated signals representative of error syndrome words and a pattern of elements forming the parity check matrix.

12. A method for use in detecting and correcting errors according to claim 9, in which the step of generating a number of signals representative of error syndrome words includes the steps of obtaining k syndrome words, $S_0$ to $S_{k-1}$, by multiplying one block $V^T$ of n received digital data words and said parity check matrix H, so that $$H \cdot V^T = \begin{Bmatrix} S_0 \\ S_1 \\ \cdot \\ \cdot \\ \cdot \\ S_{k-2} \\ S_{k-1} \end{Bmatrix}$$

where the parity check matrix H has n columns and k rows, and in which each element of one predetermined row is selected from $\alpha^0 (-1)$ to $\alpha^{2m-2}$, the element $\alpha$ being a root to satisfy $F(x)=0$ when $F(x)$ is an irreducible polynomial on a Galois field $GF(2)$, so that the same value does not appear twice in said predetermined row, and wherein the elements in the remaining rows are selected to be a given power, for all the elements in each respective row, of the corresponding elements in said predetermined row.

13. A method for use in detecting and correcting errors according to claim 12, in which the step of generating a plurality of signals representative of error constant words includes the further steps of obtaining error constant words A, B, and C based upon said syndromes, so that:

$$\begin{bmatrix} A_1 = S_0 S_2 + S_1^2 \\ B_1 = S_1 S_2 + S_0 S_3 \\ C_1 = S_1 S_3 + S_2^2 \end{bmatrix}$$

$$\begin{bmatrix} A_2 = S_1 S_3 + S_2^2 \\ B_2 = S_2 S_3 + S_1 S_4 \\ C_2 = S_2 S_4 + S_3^2 \end{bmatrix}$$

.
.
.

$$\begin{bmatrix} A_{k-3} = S_{k-4} S_{k-2} + S_{k-3}^2 \\ B_{k-3} = S_{k-3} S_{k-2} + S_{k-4} S_{k-1} \\ C_{k-3} = S_{k-3} S_{k-1} + S_{k-2}^2 \end{bmatrix}$$

14. A method for use in detecting and correcting errors according to claim 13, in which the step of determining whether the generated signals representative of error words all have zero signal level includes the steps determining when $S_o=S_3=S_4 \ldots =S_{k-1}=0$, $A_1=A_2= \ldots =A_{k-3}=0$, $B_1=B_2= \ldots =B_{k-3}=0$ and $C_{k-3}=0$ are satisfied and producing a signal indicating that there is no error word.

15. A method for use in detecting and correcting errors according to claim 13, in which the step of determining whether all generated signals representative of error syndrome words have a nonzero signal level includes the steps of determining when $S_0 \neq 0$, $S_3 \neq 0$, $S_4 \neq 0, \ldots, S_{k-1} \neq 0$, $A_{k'}=0$, $B_{k'}=0$ are satisfied, where k'=1 to k−3 and $C_{k-3}=0$, and producing a signal indicating there is one word error.

16. A method for use, in detecting and correcting errors according to claim 13, in which said step of determining that not more than two words error are present includes the steps of determining when $A_{k'}=0$, $B_{k'}=0$ and $C_{k-3}=0$ are satisfied, generating respective signals according to:

$$\left(\frac{B_1}{A_1} = \frac{B_2}{A_2} = \ldots = \frac{B_{k-3}}{A_{k-3}} = D\right)$$

$$\left(\frac{C_1}{A_1} = \frac{C_2}{A_2} = \ldots = \frac{C_{k-3}}{A_{k-3}} = E\right)$$

and solving an error location equation of $\alpha^{2i} + D\alpha^i + E = 0$ to detect two word error locations i and j.

17. Apparatus for use in performing error detection and correction on a received coded digital data signal to which a selected number of error check words have been added comprising:

memory means for memorizing said received digital data signal;

error syndrome word generating means connected to receive said digital data signal for generating a plurality of error syndrome words therefrom;

calculating circuit means having first inputs connected to receive said plurality of error syndrome words for generating a first plurality of error constant words therefrom and having second inputs connected to receive words for generating a plurality of error patterns therefrom;

first buffer register means connected to receive said first plurality of error constant words from said calculating circuit means;

read only memory means containing first and second roots of an irreducible polynominal on Galois field GF(2);

error location decoder means connected to receive said first plurality of error constant words from said first buffer register means and said first and second roots from said read only memory means for producing a second plurality of error constant words and error location words;

error judging means connected to receive said first plurality of error constant words from said first buffer register means and said plurality of error syndrome words for determining whether there is an error, whether the error is one word error, whether the error is two word errors, whether the error is more than two word errors and producing a control signal to which said calculating circuit means and said error location decoder means are responsive;

means for feeding said second plurality of error constant words, said error location words, and at least one of said first plurality of error constant words to said second inputs of said calculating circuit means;

second buffer register means receiving said error pattern signals from said calculating circuit means; and error correction means connected to the output of said memory means and to the outputs of said second buffer register means for correcting the output of said memory means in accordance with said error pattern signal from said second buffer register means.

18. Apparatus for use in performing error detection and correction according to claim 17, further comprising controller means for supplying synchronizing clock pulses to said error syndrome word generating means, said error judging means, said calculating circuit means, said first and second buffer register means, said error location decoder means, and said read only memory means.

19. Apparatus for use in performing error detection and correction according to claim 17, in which said error syndrome word generating means includes syndrome calculation means for obtaining k syndrome words $S_0$ to $S_{k-1s}$ by calculating one block $V^T$ of received n words in said coded digital data signal by a parity check matrix H $$H \cdot V^T = \begin{bmatrix} S_0 \\ S_1 \\ \cdot \\ \cdot \\ S_{k-2} \\ S_{k-1} \end{bmatrix}$$

where the parity check matrix H has n columns and k rows, in which each element of one predetermined row is selected from $\alpha^0 (=1)$ to $\alpha^{2m-2}$, $\alpha$ being a root to satisfy $F(x)=0$, where $F(x)$ is an irreducible polynomial, on a Galois field GF(2), so that the same value does not appear twice in said predetermined row, and wherein the elements in the remaining rows are selected to be a given power, for all the elements in each respective row, of the corresponding elements in said predetermined row.

20. Apparatus for use in performing error correcting and detection according to claim 19, in which said calculating circuit means includes for obtaining the error constant words A, B and C so that $$A_1 = S_0 S_2 + S_1^2$$

$$B_1 = S_1 S_2 + S_0 S_3$$

$$C_1 = S_1 S_3 + S_2^2$$

$$A_2 = S_1 S_3 + S_2^2$$

$$B_2 = S_2 S_3 + S_1 S_4$$

$$C_2 = S_2 S_4 + S_3^2$$

$$A_{k-3} = S_{k-4} S_{k-2} + S_{k-3}^2$$

$$B_{k-3} = S_{k-3} S_{k-2} + S_{k-4} S_{k-1}$$

$$C_{k-3} = S_{k-3} S_{k-1} + S_{k-2}^2.$$

21. Apparatus for use in performing error detection and correction according to claim 20, in which said error judging means includes syndrome equality determination means for determining when $S_0 = S_3 = S_4 = \ldots = S_{k-1} = 0$, $A_1 = A_2 = \ldots = A_{k-3}=0$, $B_1 = B_2 = \ldots = B_{k-3} = 0$, and $C_{k-3}=0$ are satisfied, and producing a signal indicating that there is no error word.

22. Apparatus for use in performing error detection and correction according to claim 20, in which said error judging means includes syndrome equality determination means for determining when $S_0 \neq 0$, $S_3 \neq 0$, $S_4 \neq 0$, = ..., $S_{k-1} \neq 0$, $A_{k'}=0$, $B_{k'}=0$, are satisfied and producing a signal indicating that there is one word error.

23. Apparatus for use in performing error detection and correction according to claim 20, in which said error judging means includes syndrome equality determination means for determining when $A_k \neq 0$, $B_{k'} \neq 0$ and $C_{k-3}=0$ are satisfied and generating followings be assumed $$\left(\frac{B_1}{A_1} = \frac{B_2}{A_2} = \ldots = \frac{B_{k-3}}{A_{k-3}} = D\right)$$

$$\left(\frac{C_1}{A_1} = \frac{C_2}{A_2} = \ldots = \frac{C_{k-3}}{A_{k-3}} = E\right),$$

means for generating error location equation of $\alpha^{2i} + D\alpha^i + E = 0$, and means for solving said error location equation to detect two word error locations i and j.

* * * * *